US012740196B2

(12) United States Patent
Peng et al.

(10) Patent No.: US 12,740,196 B2
(45) Date of Patent: Sep. 15, 2026

(54) MICRO LIGHT-EMITTING ELEMENT AND MICRO LIGHT-EMITTING ELEMENT DISPLAY DEVICE

(71) Applicant: PlayNitride Display Co., Ltd., MiaoLi County (TW)

(72) Inventors: You-Lin Peng, MiaoLi County (TW); Fei-Hong Chen, MiaoLi County (TW); Pai-Yang Tsai, MiaoLi County (TW); Tzu-Yang Lin, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 888 days.

(21) Appl. No.: 17/974,560

(22) Filed: Oct. 27, 2022

(65) Prior Publication Data

US 2024/0113261 A1 Apr. 4, 2024

(30) Foreign Application Priority Data

Sep. 29, 2022 (TW) ................................. 111136904

(51) Int. Cl.
*H10H 20/831* (2025.01)
*H10H 20/857* (2025.01)
*H10W 90/00* (2026.01)

(52) U.S. Cl.
CPC ...... *H10H 20/8312* (2025.01); *H10H 20/857* (2025.01); *H10W 90/00* (2026.01)

(58) Field of Classification Search
CPC ........ H10H 29/10; H10H 20/00; H10H 20/80; H01L 33/145
See application file for complete search history.

(56) References Cited

U.S. PATENT DOCUMENTS 10,297,719 B2 * 5/2019 Chen .................... H10H 20/835
11,296,254 B2 * 4/2022 Lin ..................... H01L 25/0753
2018/0374987 A1 12/2018 Zou

FOREIGN PATENT DOCUMENTS

CN 103489983 1/2014
CN 112259658 1/2021
TW 1646701 1/2019

(Continued)

OTHER PUBLICATIONS

"Office Action of China Counterpart Application", issued on Jan. 18, 2025, p. 1-p. 5.

(Continued)

*Primary Examiner* — Mohammad M Choudhry
(74) *Attorney, Agent, or Firm* — JCIPRNET

(57) ABSTRACT

A micro light-emitting element including an epitaxial structure, an insulating layer, an electrode structure and a sacrificial layer is provided. The epitaxial structure includes a top surface and a side surface. The insulating layer is disposed on the top surface and the side surface of the epitaxial structure, and the insulating layer includes an opening. The electrode structure is disposed on the top surface of the epitaxial structure and extends through the opening of the insulating layer to be electrically connected to the epitaxial structure. The sacrificial layer is sandwiched between a surface of the insulating layer and the corresponding electrode structure. A micro light-emitting element display device is further provided.

13 Claims, 9 Drawing Sheets

(56) References Cited

FOREIGN PATENT DOCUMENTS

| | | |
|---|---|---|
| TW | 202044610 | 12/2020 |
| WO | 2019051764 | 3/2019 |

OTHER PUBLICATIONS

"Office Action of Taiwan Counterpart Application", issued on May 2, 2023, p. 1-p. 5.
"Notice of allowance of China Counterpart Application", issued on May 12, 2025, p. 1-p. 4.

* cited by examiner

MICRO LIGHT-EMITTING ELEMENT AND MICRO LIGHT-EMITTING ELEMENT DISPLAY DEVICE

CROSS-REFERENCE TO RELATED APPLICATION

This application claims the priority benefit of Taiwan application serial no. 111136904, filed on Sep. 29, 2022. The entirety of the above-mentioned patent application is hereby incorporated by reference herein and made a part of this specification.

BACKGROUND

Technical Field

The invention relates to a light-emitting element and a display device, and particularly relates to a micro light-emitting element and a micro light-emitting element display device.

Description of Related Art

At present, if a micro light-emitting element on a circuit board is damaged and needs to be reworked, in a process of removing the micro light-emitting element, a corresponding pad on the circuit board may suffer great damage, and if a new micro light-emitting element (used to replace the damaged micro light-emitting element) is to be bonded to this pad later, poor bonding is likely to occur.

To prevent such a situation, some circuit boards are designed with spare pads reserved for bonding with new micro light-emitting elements. In this case, in addition to the pads for the initial connection with the micro light-emitting elements on the circuit board, space is further reserved for the spare pads required for the replacement, which affects a circuit layout on the circuit board.

SUMMARY

The invention is directed to a micro light-emitting element, where a used circuit board does not need to be provided with a substitute pad, and when the micro light-emitting element is removed from the circuit board, the pad on the circuit board is not easy to be damaged.

The invention is directed to a micro light-emitting element display device, in which a circuit board does not need to be provided with a substitute pad, and when a micro light-emitting element is removed from the circuit board, the pad on the circuit board is not easy to be damaged.

The invention provides a micro light-emitting element including an epitaxial structure, an insulating layer, an electrode structure and a sacrificial layer. The epitaxial structure includes a top surface and a side surface. The insulating layer is disposed on the top surface and the side surface of the epitaxial structure, and the insulating layer includes an opening. The electrode structure is disposed on the top surface of the epitaxial structure and extends through the opening of the insulating layer to be electrically connected to the epitaxial structure. The sacrificial layer is sandwiched between a surface of the insulating layer and the corresponding electrode structure.

The invention provides a micro light-emitting element display device including a display backplane and a plurality of micro light-emitting elements. The display backplane includes a plurality of backplane pads. The micro light-emitting elements are arranged on the display backplane, and each of the micro light-emitting elements includes an epitaxial structure, an insulating layer, and an electrode structure. The epitaxial structure includes a top surface and a side surface. The insulating layer is disposed on the top surface and the side surface of the epitaxial structure, and the insulating layer includes an opening. The electrode structure is disposed on the top surface of the epitaxial structure and extends through the opening of the insulating layer to be electrically connected to the epitaxial structure and connected to at least one of the backplane pads, where there is a gap between the electrode structure and a surface of the insulating layer.

Based on the above description, the electrode structure of the micro light-emitting element is arranged on the top surface of the epitaxial structure and extends through the opening of the insulating layer to be electrically connected to the epitaxial structure. The sacrificial layer is sandwiched between the surface of the insulating layer and the corresponding electrode structure. Namely, a part of the electrode structure (electrode pad) is separated from the surface of the insulating layer by the sacrificial layer, and another part of the electrode structure is connected to the above part and extends through the opening of the insulating layer to be electrically connected to the epitaxial structure (electrode pillar). When the micro light-emitting element is to be removed from the backplane pads on the display backplane (or other circuit boards), the sacrificial layer is removed first, and a connection strength between the insulating layer and the above-mentioned part of the electrode structure is reduced, and it is easy to break from a part of the electrode structure, such as the part of the electrode pillar, so that the epitaxial structure and the insulation layer may be removed from the backplane pads of the display backplane. Since a fracture position of the electrode structure is in another part of the electrode structure rather than the above-mentioned part connected with the backplane pads of the display backplane, after the epitaxial structure and the insulating layer are removed from the backplane pads of the display backplane, the backplane pads and the connected circuits themselves are not pulled and damaged, and may be used for connecting with new micro light-emitting elements. Therefore, there is no need to set spare pads on the display backplane (or other circuit boards), and the circuit layout on the display backplane (or other circuit boards) may be more flexible and elastic.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
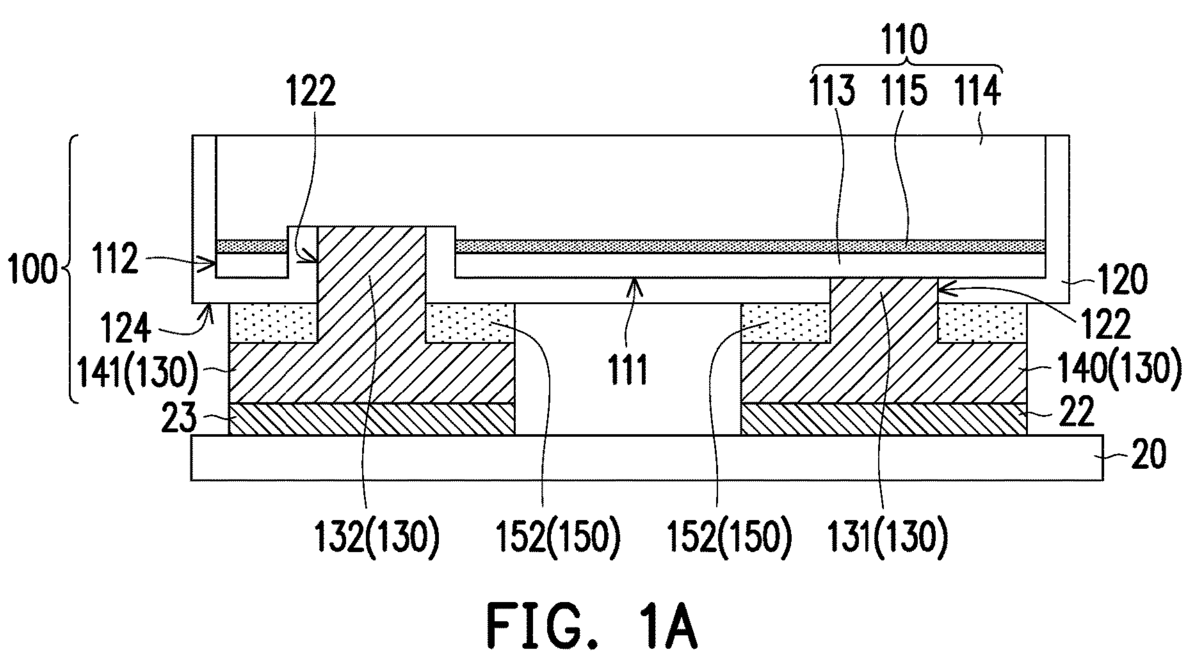
FIG. 1A is a schematic cross-sectional view of a micro light-emitting element connected to a display backplane according to an embodiment of the invention.

FIG. 1A is a schematic cross-sectional view of a micro light-emitting element connected to a display backplane according to an embodiment of the invention. It should be noted that, in FIG. 1A, a micro light-emitting element 100 is turned up and down by 180 degrees, and is disposed on a display backplane 20 in a flip-chip manner. Referring to FIG. 1A, in the embodiment, the micro light-emitting device 100 includes an epitaxial structure 110, an insulating layer 120, an electrode structure 130 and a sacrificial layer 150. The epitaxial structure 110 includes a top surface 111, a side surfaces 112, a first type semiconductor layer 113 close to the top surface 111, a second type semiconductor layer 114 away from the top surface 111, and a light-emitting layer 115 is located between the first type semiconductor layer 113 and the second type semiconductor layer 114. One of the first type semiconductor layer 113 and the second type semiconductor layer 114 is, for example, a P-type semiconductor, and the other one is, for example, an N-type semiconductor.

The insulating layer 120 is disposed on the top surface 111 and the side surface 112 of the epitaxial structure 110, and the insulating layer 120 includes an opening 122 above the top surface 111 of the epitaxial structure 110.

The electrode structure 130 is arranged on the top surface 111 of the epitaxial structure 110 and extends through the opening 122 of the insulating layer 120 to be electrically connected to the epitaxial structure 110. To be specific, in the embodiment, the electrode structure 130 includes a first electrode pad 140, a second electrode pad 141, a first electrode pillar 131 connected to the first electrode pad 140, and a second electrode pillar 132 connected to the second electrode pad 141. The first electrode pad 140 and the first electrode pillar 131 are electrically opposite to the second electrode pad 141 and the second electrode pillar 132.

The first electrode pad 140 and the second electrode pad 141 are located above a surface 124 of the insulating layer 120, the number of openings 122 in the insulating layer 120 is two, and the first electrode pillar 131 extends through one of the openings 122 of the insulating layer 120 to be electrically connected to the first semiconductor layer 113 of the epitaxial structure 110, and the second electrode pillar 132 extends through the other opening 122 of the insulating layer 120 to be electrically connected to the second semiconductor layer 114 of the epitaxial structure 110.

The first electrode pad 140 and the second electrode pad 141 are connected to a circuit board. In the embodiment, the first electrode pads 140 and the second electrode pads 141 are, for example, respectively connected to two backplane pads 22 and 23 of the display backplane 20, but the type of the circuit board is not limited thereto.

According to FIG. 1A, it is learned that the first electrode pad 140 and the first electrode pillar 131 are T-shaped in cross-section, and the second electrode pad 141 and the second electrode pillar 132 are T-shaped in the cross-section. Therefore, an orthogonal projection area of the first electrode pad 140 on the surface 124 (upper surface) of the insulating layer 120 is greater than and covers an orthogonal projection area of the corresponding first electrode pillar 131 on the surface 124. An orthogonal projection area of the second electrode pad 141 on the surface 124 (upper surface) of the insulating layer 120 is greater than and covers an orthogonal projection area of the corresponding second electrode pillar 132 on the surface 124. Certainly, in other embodiments, the shapes of the first electrode pad 140 and the first electrode pillar 131 on the cross-section and the shapes of the second electrode pad 141 and the second electrode pillar 132 on the cross-section are not limited thereto.

In the embodiment, the sacrificial layer 150 includes two sacrificial blocks 152. One of the sacrificial blocks 152 (the sacrificial block 152 on the left in FIG. 1A) of the sacrificial layer 150 is sandwiched between the surface 124 of the insulating layer 120 and the first electrode pad 140, and the sacrificial block 152 is disposed around the first electrode pillar 131. An orthogonal projection area of the sacrificial block 152 of the sacrificial layer 150 on the surface 124 of the insulating layer 120 is greater than or equal to an orthogonal projection area of the first electrode structure 130 on the surface 124.

Another sacrificial block 152 of the sacrificial layer 150 (the sacrificial block 152 on the right in FIG. 1A) is sandwiched between the surface 124 of the insulating layer 120 and the second electrode pad 141, and the sacrificial block 152 is disposed around the second electrode pillar 132. An orthogonal projection area of the sacrificial block 152 of the sacrificial layer 150 on the surface 124 of the insulating layer 120 is equal to an orthogonal projection area of the electrode structure 130 on the surface 124, so that the sacrificial layer 150 and the electrode structure 130 may be formed in a same etching process.

In an embodiment, if the orthogonal projection area of the sacrificial block 152 on the surface 124 of the insulating layer 120 is greater than the orthogonal projection area of the electrode structure 130 on the surface 124, a force during bonding is relatively average.

The sacrificial layer 150 includes, for example, a glue containing benzocyclobutene (BCB) and photoresist, polyimide or a polymer material decomposed by ultraviolet light, but the type of the sacrificial layer 150 is not limited thereto. In the embodiment, the sacrificial layer 150 may be removed by means of illumination, heating or etching.

When the micro light-emitting device 100 is produced, the epitaxial structure 110 may be fabricated first, and then the insulating layer 120 may be deposited to form the opening 122 of the insulating layer 120. Next, the sacrificial layer 150 is arranged around the opening 122 of the insulating layer 120. Then, a conductive metal is deposited in the opening 122 of the insulating layer 120 and on the top surface of the sacrificial layer 150 to form the electrode structure 130.

Figure 1B:
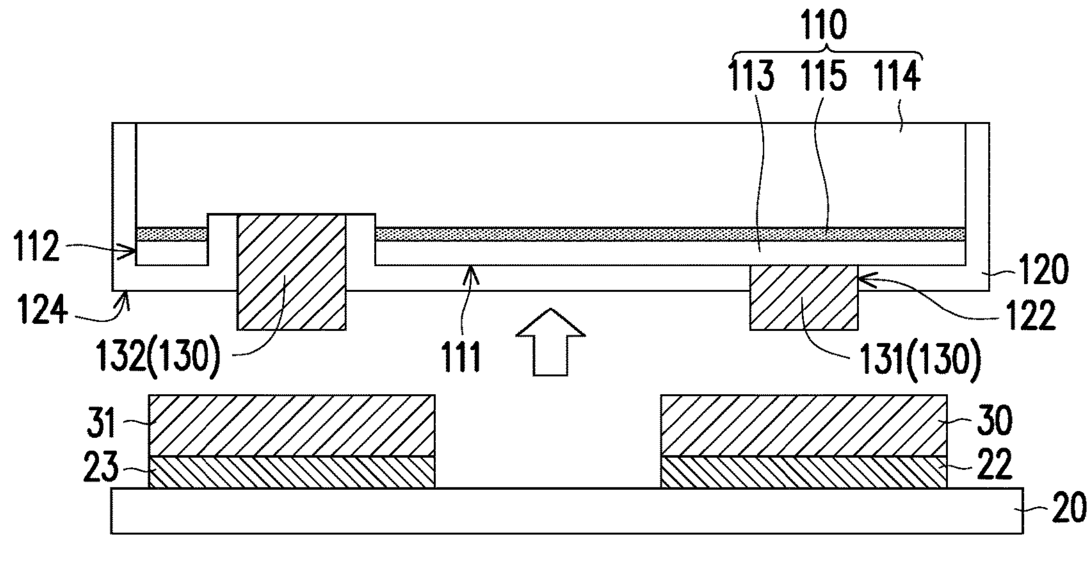
FIG. 1B is a schematic cross-sectional view of removing the micro light-emitting element of FIG. 1A from the display backplane.

FIG. 1B is a schematic cross-sectional view of removing the micro light-emitting element of FIG. 1A from the display backplane. Referring to FIG. 1B, in the embodiment, when the micro light-emitting element 100 is to be removed from the display backplane 20, the sacrificial layer 150 is removed first. Since a width of the first electrode pillar 131 is less than a width of the first electrode pad 140, and a width of the second electrode pillar 132 is less than a width of the second electrode pad 141, a structural strength of the first electrode pillar 131 is less than a structural strength of the first electrode pad 140, and a structural strength of the second electrode pillar 132 is less than a structural strength of the second electrode pad 141.

If the epitaxial structure 110 is moved in a direction away from the display backplane 20 or in a direction of ejecting from/injecting toward a drawing plane, as shown in FIG. 1B, a boundary between the first electrode pillar 131 and the first electrode pad 140 and a boundary between the second electrode pillar 132 and the second electrode pad 141 are likely to crack. Therefore, the first electrode pad 140 and the second electrode pad 141 of FIG. 1A will at least partially remain on the two backplane pads 22 and 23 to form two residual electrode structures 30 and 31 of FIG. 1B.

Therefore, after the epitaxial structure 110 and the insulating layer 120 are removed from the backplane pads 22 and 23 of the display backplane 20, the backplane pads 22 and 23 and the connected circuits (located on the display backplane 20, not shown) are not pulled and damaged, which may be connected to a new micro light-emitting element 100.

Figure 1C:
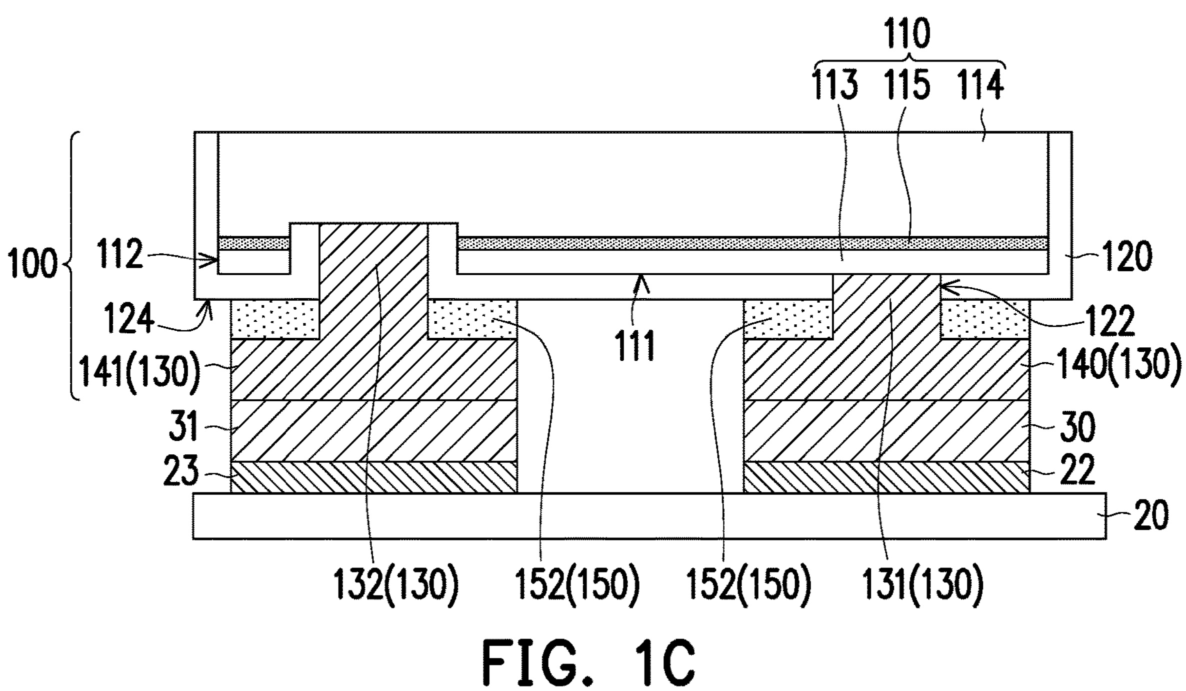
FIG. 1C is a schematic cross-sectional view of connecting another micro light-emitting element of FIG. 1A to the display backplane.

FIG. 1C is a schematic cross-sectional view of connecting another micro light-emitting element of FIG. 1A to the display backplane. Refer to FIG. 1C, in the embodiment, after another micro light-emitting element 100 is connected to the display backplane 20, the first electrode pad 140 and the second electrode pad 141 of the micro light-emitting element 100 are respectively connected to the two residual electrode structures 30 and 31 for bonding to the display backplane 20, so as to complete the rework to achieve an effect of in-situ repair.

Therefore, there is no need to set spare pads on the display backplane 20 (or other circuit boards), and the circuit layout on the display backplane 20 (or other circuit boards) may be more flexible and elastic, which may improve transmittance of the display device.

The micro-light-emitting elements of other patterns are described below, and only the differences between the different embodiments are described, and the unexplained parts are the same as or similar to the above embodiments.

Figure 2:
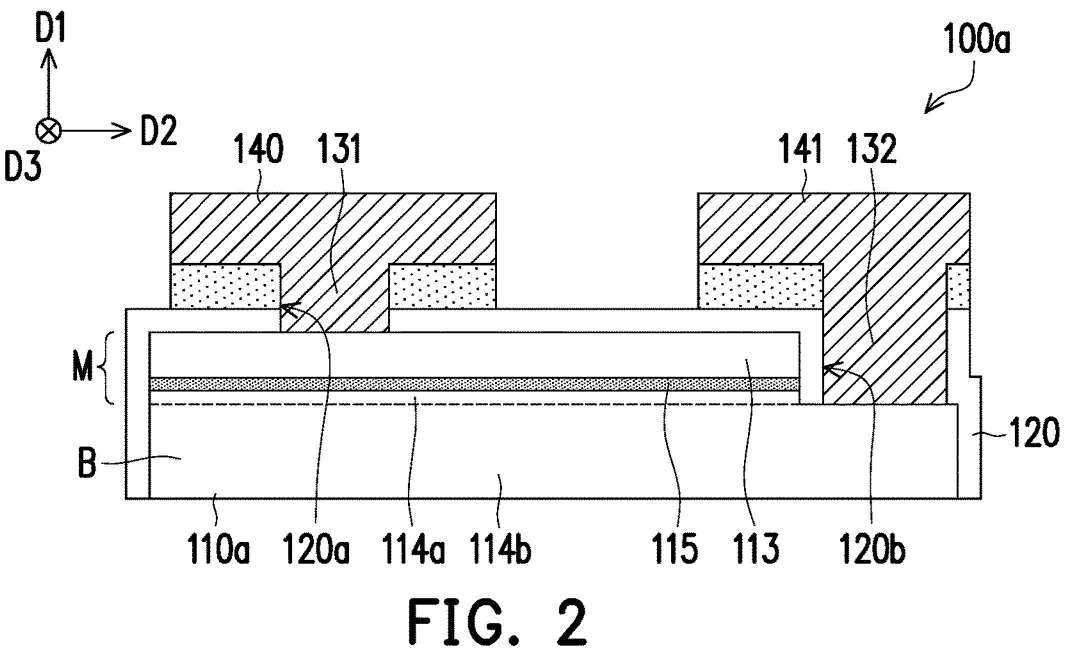
FIG. 2 is a schematic cross-sectional view of a micro light-emitting element according to another embodiment of the invention.

FIG. 2 is a schematic cross-sectional view of a micro light-emitting element according to another embodiment of the invention. It should be noted that, since a micro light-emitting element 100*a* of FIG. 2 has not been disposed on the display backplane 20, it presents an upside down state compared to the micro light-emitting element 100 of FIG. 1A. Referring to FIG. 2, in the embodiment, a shape of an epitaxial structure 110*a* is slightly different from that in the previous embodiment. In detail, in the embodiment, the first type semiconductor layer 113, the light-emitting layer 115 and a first portion 114*a* of the second type semiconductor layer 114 form a mesa M. A second portion 114*b* of the second type semiconductor layer 114 forms a base B with respect to the mesa M. A first opening 120*a* of the insulating layer 120 is located on the mesa M, and a second opening 120*b* exposes the second portion 114*b* of the second type semiconductor layer 114 and is located on the base B. Specifically, the micro light-emitting element 100*a* is, for example, a horizontal micro light-emitting element.

Figure 3A:
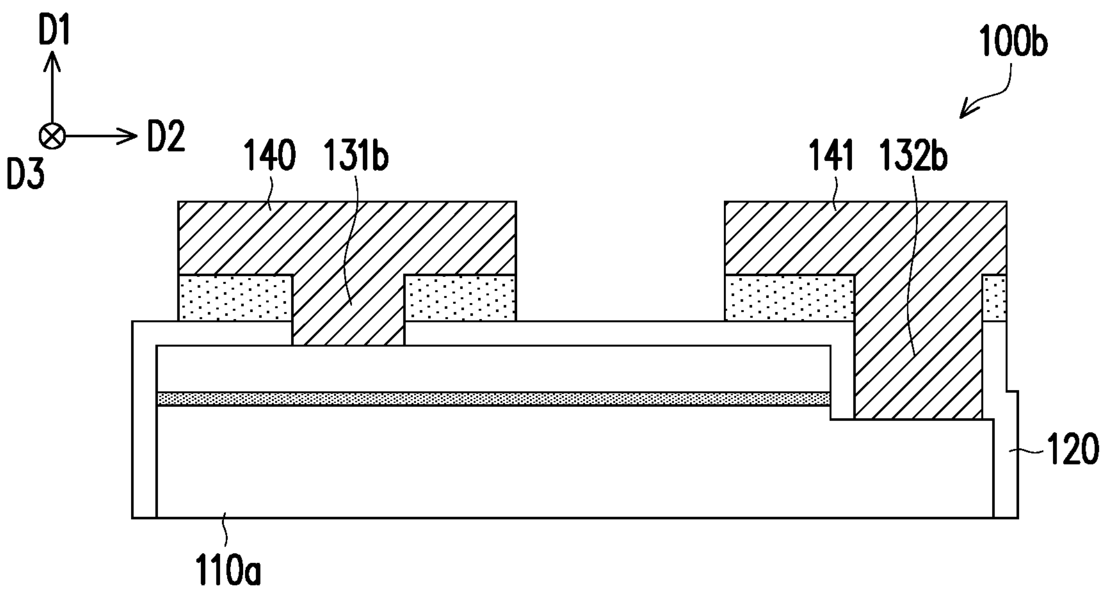
FIG. 3A is a schematic cross-sectional view of a micro light-emitting device according to another embodiment of the invention.
Figure 3B:
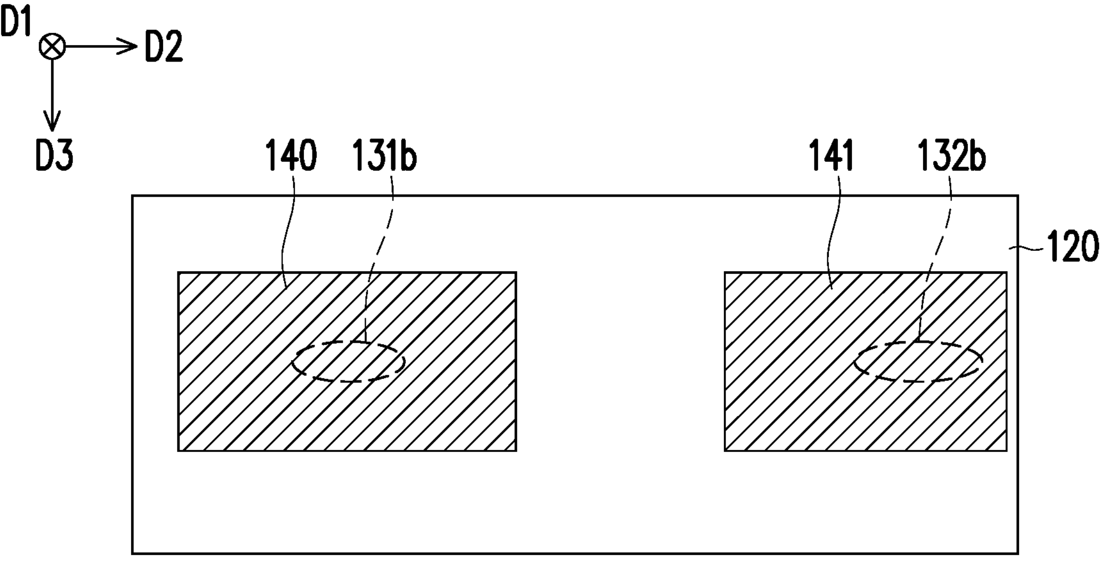
FIG. 3B is a schematic top view of the micro light-emitting element of FIG. 3A.

FIG. 3A is a schematic cross-sectional view of a micro light-emitting device according to another embodiment of the invention. FIG. 3B is a schematic top view of the micro light-emitting element of FIG. 3A. Referring to FIG. 3A to 3B, in the embodiment, a first direction D1 is an up and down direction of FIG. 3A, i.e., a height direction of a micro light-emitting element 100*b*. A second direction D2 is a left-right direction in FIG. 3A, i.e., length direction of the micro light-emitting element 100*b*. The first electrode pillar 131 and the second electrode pillar 132 extend along the first direction D1, and a connection line between the first electrode pad 140 and the second electrode pad 141 extends along the second direction D2.

As shown in FIG. 3B, a third direction D3 is a width direction of the micro light-emitting element 100*b*, and the third direction D3 is perpendicular to the first direction D1 and the second direction D2. In the embodiment, cross-sections of the first electrode pillar 131*b* and the second electrode pillar 132*b* in the first direction D1 are two ovals, and lengths of the two ovals in the second direction D2 are different from lengths of the two ovals in the third direction D3.

Specifically, the length of the cross-section of the first electrode pillar 131*b* and the length of the cross-section of the second electrode pillar 132*b* in the first direction D1 are greater than lengths thereof in the third direction D3. When the micro light-emitting element 100*b* is to be removed later, a force may be applied along the third direction D3 to help separating the first electrode pillar 131*b* from the first electrode pad 140 and separating the second electrode pillar 132*b* from the second electrode pad 141.

Figure 4:
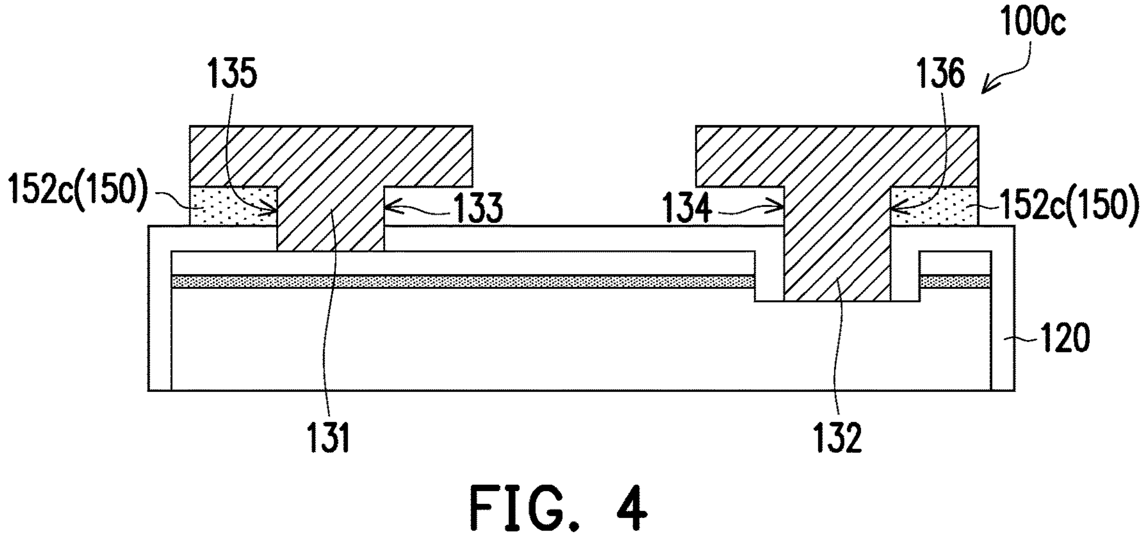
FIG. 4 is a schematic cross-sectional view of a micro light-emitting element according to another embodiment of the invention.

FIG. 4 is a schematic cross-sectional view of a micro light-emitting element according to another embodiment of the invention. Referring to FIG. 4, in the embodiment, the first electrode pillar 131 and the second electrode pillar 132 of a micro light-emitting element 100*c* respectively include two inner side surfaces 133 and 134 facing each other and two outer sides surfaces 135 and 136 facing away from each other, and the sacrificial layer 150 may be removed by light irradiation. By respectively disposing two sacrificial blocks 152*c* on the two outer side surfaces 135 and 136, the two inner side surfaces 133 and 134 are exposed. Since the outer side surfaces 135, 136 are more easily exposed to light, such design helps the removal of the sacrificial blocks 152*c*.

Figure 5:
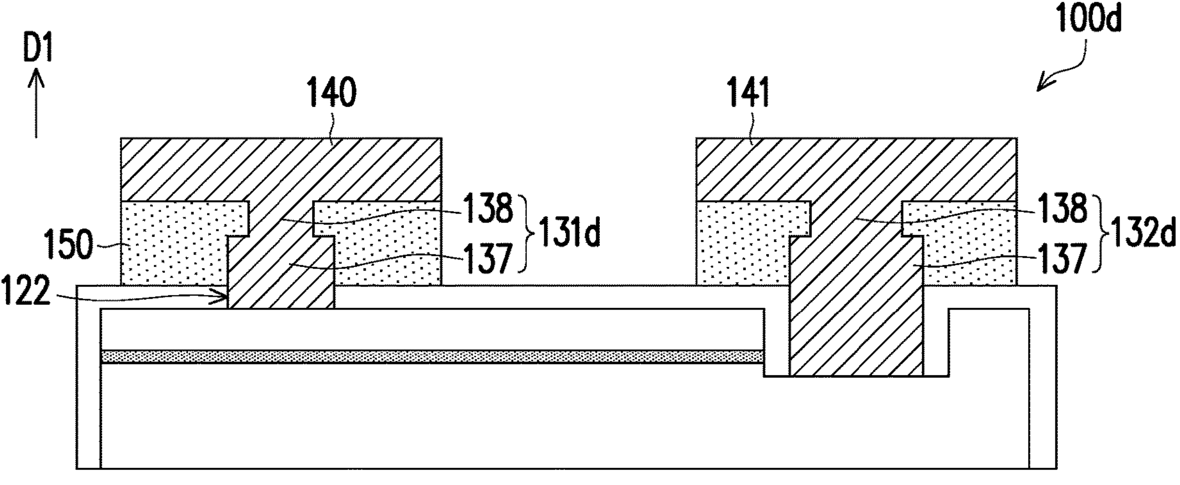
FIG. 5 is a schematic cross-sectional view of a micro light-emitting element according to another embodiment of the invention.

FIG. 5 is a schematic cross-sectional view of a micro light-emitting element according to another embodiment of the invention. Referring to FIG. 5, in the embodiment, a first electrode pillar 131*d* and a second electrode pillar 132*d* of a micro light-emitting element 100*d* extend along the first direction D1, and each of the first electrode pillar 131*d* and the second electrode pillar 132*d* includes a first segment portion 137 and a second segment portion 138 in the first direction D1, and the second segment portions 138 are respectively located between the first segment portion 137 and the first electrode pad 140 and the second electrode pad 141.

The first segment portion 137 extends through the opening 122 of the insulating layer 120, and a part of the first segment portion 137 and the second segment portion 138 are surrounded by the sacrificial layer 150. The first segment portion 137 is located in the opening 122, and the sacrificial layer 150 contacts the second segment portion 138. In the embodiment, a cross-sectional area of the second segment portion 138 is less than a cross-sectional area of the first segment portion 137. When the micro light-emitting device 100 is to be removed, such design facilitates the fracture between the first electrode pillar **131*d* and the first electrode pad 140 and the fracture between the second electrode pillar 132*d* and the second electrode pad 141. In a not-shown embodiment, the first segment portion 137 may all be located in the opening, and the second segment 138** may be exposed outside the opening.

Figure 6:
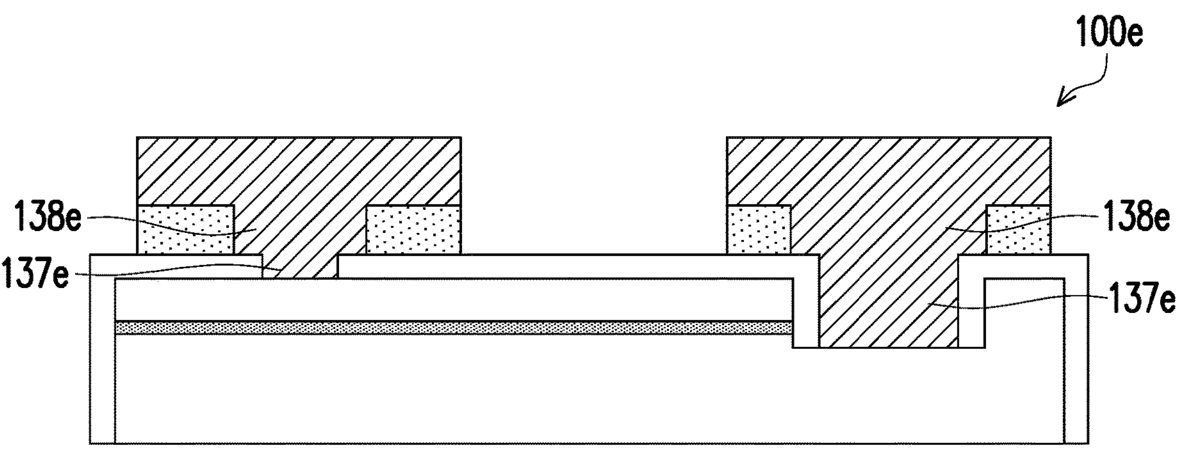
FIG. 6 is a schematic cross-sectional view of a micro light-emitting element according to another embodiment of the invention.

Certainly, a dimensional relationship between the first segment portion 137 and the second segment portion 138 is not limited thereto. FIG. 6 is a schematic cross-sectional view of a micro light-emitting element according to another embodiment of the invention. Referring to FIG. 6, in a micro light-emitting element **100*e* of the embodiment, a cross-sectional area of a second segment portion 138*e* is greater than a cross-sectional area of a first segment portion 137*e*. Preferably, a ratio of the cross-sectional area of the first section portion 137*e* to the cross-sectional area of the second section portion 138*e* is greater than or equal to 90%, which achieves stability of the electrode structure configuration, and the second segment portion 138*e*** is not too large to be unfavourable for subsequent fractures.

Figure 7:
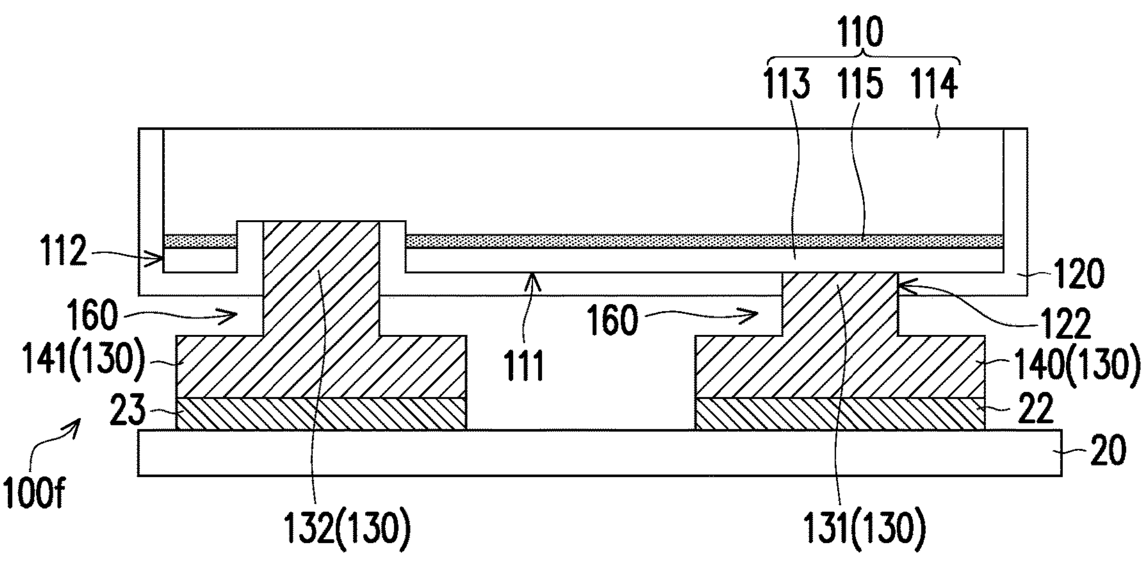
FIG. 7 is a schematic cross-sectional view of a micro light-emitting element connected to a display backplane according to another embodiment of the invention.

FIG. 7 is a schematic cross-sectional view of a micro light-emitting element connected to the display backplane 20 according to another embodiment of the invention. Refer to FIG. 7, in the embodiment, after a micro light-emitting element **100*f* is connected to the display backplane 20, even if the micro light-emitting element 100*f* is not to be removed, the sacrificial layer 150 (FIG. 1A) may be removed first, so that there is a gap 160 between the first electrode pad 140 and the insulating layer 120, and there is the gap 160 between the second electrode pad 141 and the insulating layer 120. In this way, if the micro light-emitting element 100*f* is to be replaced subsequently, the step of removing the sacrificial layer 150** is unnecessary to be performed. A situation that the residual of the sacrificial layer affects a yield of the display device is avoided.

Figure 8A:
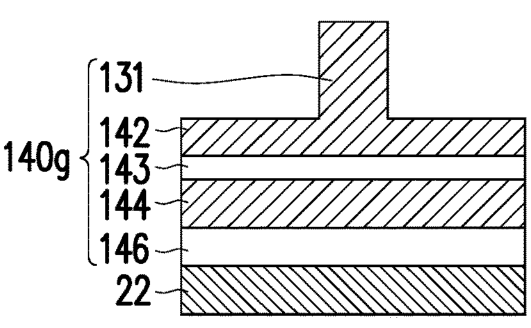
FIG. 8A is a schematic cross-sectional view of an electrode structure and a backplane pad before a reflow process according to an embodiment of the invention.

FIG. 8A is a schematic cross-sectional view of an electrode structure and a backplane pad before a reflow process according to an embodiment of the invention. It should be noted that in FIG. 8A, a first electrode pad **140*g* is taken as an example for description, but the second electrode pad is also in the same configuration, and detail thereof is not repeated. The structure of FIG. 8**A may be applied to all of the embodiments of the invention, but the types of the electrode structure in all the embodiments of the invention are not limited thereto.

Referring to FIG. 8A, in the embodiment, the first electrode pad **140*g* and the backplane pad 22 are connected through a solder layer 146, and the first electrode pad 140*g* include a first bonding layer 142, a barrier layer 143 and a second bonding layer 144 arranged in sequence, where the first bonding layer 142 is connected to the first electrode pillar 131. In the embodiment, the first bonding layer 142 is, for example, a gold layer. In other embodiments, the first bonding layer 142 may also be a multi-layer structure, which may include a gold layer and a chromium/titanium/aluminum layer. The barrier layer 143, for example, includes materials such as nickel, platinum, titanium tungsten, tungsten, etc. The barrier layer 143 may be a multi-layer structure to avoid eutectic formation of all of the first bonding layers 142. The second bonding layer 144 is, for example, a gold layer. In other embodiments, the second bonding layer 144 may also be a multi-layer structure, which may include a gold layer and a chromium/titanium/aluminum layer. The first bonding layer and the second bonding layer are of the same material. Certainly, the materials of the first bonding layer 142, the barrier layer 143 and the second bonding layer 144** are not limited thereto.

Figure 8B:
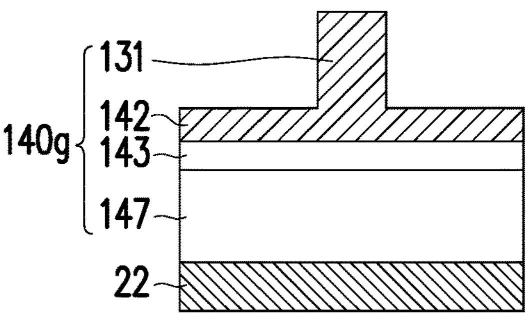
FIG. 8B is a schematic cross-sectional view of the electrode structure and the backplane pad of FIG. 8A after the reflow process.

FIG. 8B is a schematic cross-sectional view of the electrode structure and the backplane pad of FIG. 8A after the reflow process. Referring to FIG. 8B, the first electrode pad **140*g* and the backplane pad 22 are connected through the solder layer 146. After the reflow process, the second bonding layer 144 and the solder layer 146 of FIG. 8A are changed into a eutectic layer 147 of FIG. 8**B.

Figure 8C:
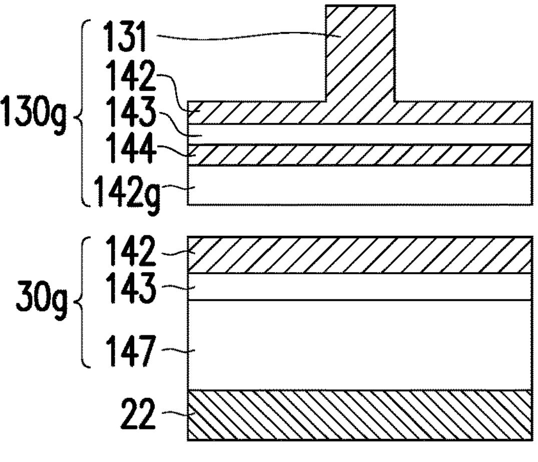
FIG. 8C is a schematic cross-sectional view of a new electrode structure to be connected to a residual electrode structure and a backplane pad.

FIG. 8C is a schematic cross-sectional view of a new electrode structure to be connected to a residual electrode structure and a backplane pad. Referring to FIG. 8C, in order to remove the epitaxial structure 110 (FIG. 1B), the first electrode pillar 131 (FIG. 8B) and the first bonding layer 142 are broken at the boundary to form a residual electrode structure **30*g*. Subsequently, a new electrode structure 130*g* is connected to the first bonding layer 142. In the embodiment, the new electrode structure 130*g* may include the first electrode pillar 131 and the first bonding layer 142 (gold layer), the barrier layer 143, the second bonding layer 144 (gold layer) and a solder layer 142*g* (a gold layer and a tin layer), where the solder layer 142*g* may form a eutectic layer (not shown) with the first bonding layer 142 of the residual electrode structure 30*g***.

In the aforementioned embodiments, the micro light-emitting element is, for example, a flip-chip micro light-emitting element, but the type of the micro light-emitting element is not limited thereto.

Figure 9:
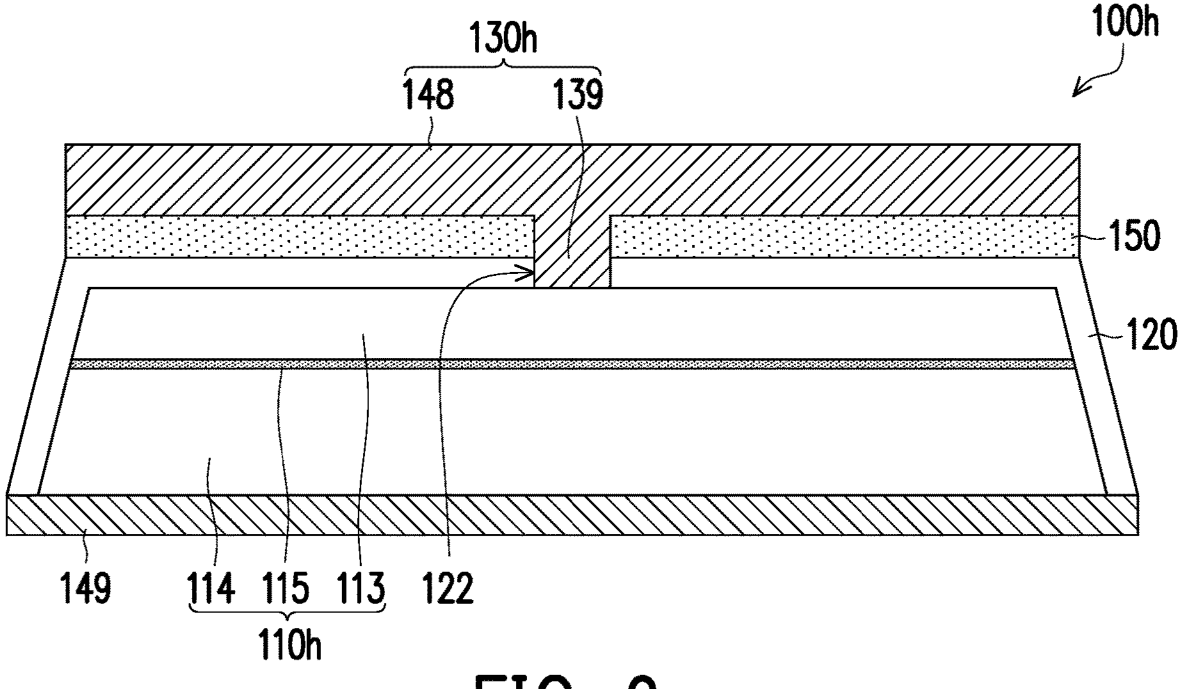
FIG. 9 is a schematic cross-sectional view of a micro light-emitting device according to another embodiment of the invention.

FIG. 9 is a schematic cross-sectional view of a micro light-emitting device 100 according to another embodiment of the invention. Referring to FIG. 9, in the embodiment, a micro light-emitting element **100*h* is a vertical micro light-emitting element. An electrode structure 130*h* includes an electrode pad 148 and an electrode pillar 139 connected to the electrode pad 148. The electrode pillar 139 extends through the opening 122 and is connected to the first semiconductor layer 113, and another electrode pad 149 is directly disposed on the second semiconductor layer 114. Similarly, the sacrificial layer 150 is disposed between the electrode pad 148 and the insulating layer 120, and the design of the sacrificial layer 150 and the electrode pillar 139 helps to remove the epitaxial structure 110**.

Figure 10:
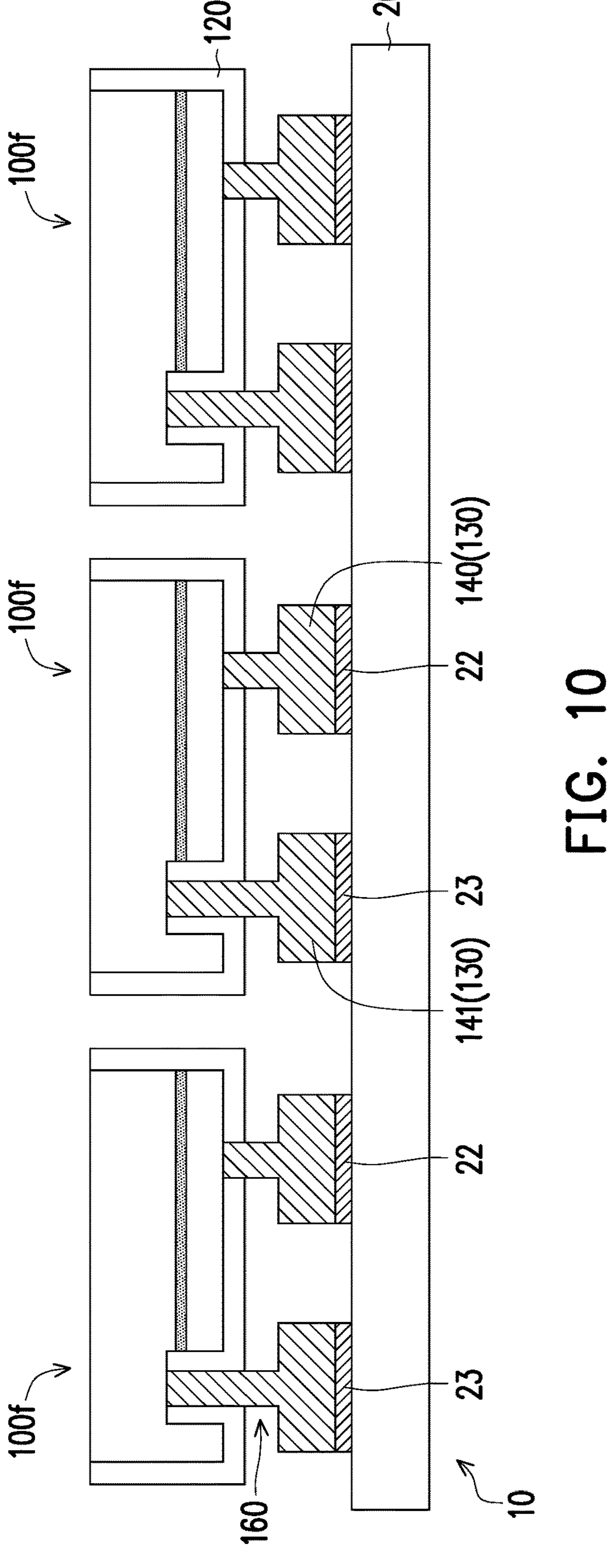
FIG. 10 is a schematic cross-sectional view of a micro light-emitting element display device according to an embodiment of the invention.

FIG. 10 is a schematic cross-sectional view of a micro light-emitting element display device according to an embodiment of the invention. Referring to FIG. 10, in the embodiment, a micro light-emitting element display device 10 includes a display backplane 20 and a plurality of micro light-emitting elements **100*f*. The display backplane 20 includes a plurality of backplane pads 22 and 23. The micro light-emitting elements 100*f* are disposed on the display backplane 20**.

The number of the micro light-emitting elements **100*f* is, for example, three, but the number is not limited thereto. In addition, in the embodiment, the micro light-emitting element 100*f* is, for example, the micro light-emitting element 100*f* of FIG. 7. In the embodiment, a gap 160 exists between the surface 124 of the insulating layer 120 and the corresponding electrode pad. The gap 160 is an air gap 160. Certainly, in other embodiments, the micro light-emitting elements of the other embodiments described above may also be adopted. Namely, the sacrificial layer 150 (FIG. 1A) may be disposed in the gap 160. Similarly, the micro light-emitting element display device 10 of the embodiment may have the above-mentioned advantages that the micro light-emitting elements 100***f* may be easily removed without damaging the backplane pads 22 and 23 and the connected circuits.

Figure 11:
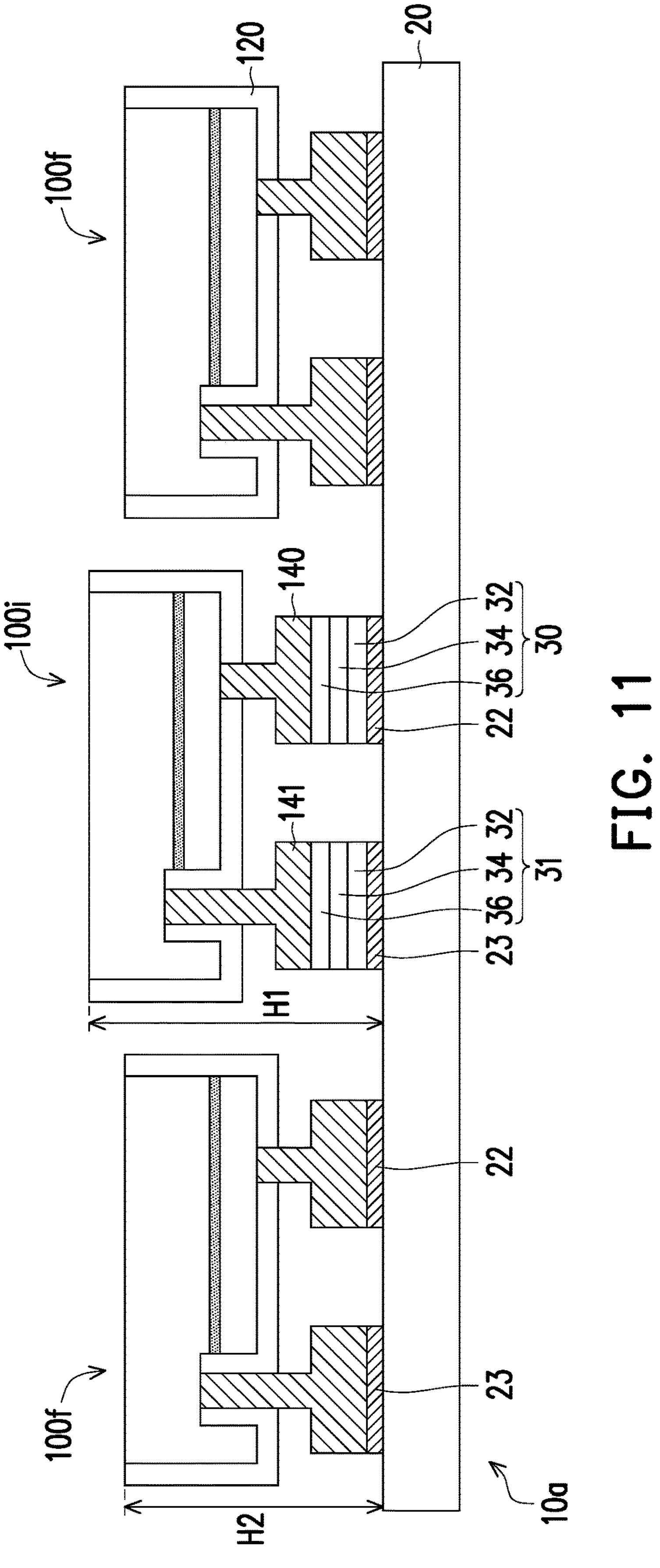
FIG. 11 is a schematic cross-sectional view of a micro light-emitting element display device according to another embodiment of the invention.

FIG. 11 is a schematic cross-sectional view of a micro light-emitting element display device according to another embodiment of the invention. Referring to FIG. 11, in the embodiment, a micro light-emitting element display device 10*a* includes a first micro light-emitting element 100*i* connected to the residual electrode structures 31 and 32, and two second micro light-emitting elements 100*f*. The first micro light-emitting element 100*i* is located in the center, and the two second micro light-emitting elements 100*f* are located on two sides of the first micro light-emitting element 100*i*.

The residual electrode structure 31 is located between the first electrode pad 140 of the first micro light-emitting element 100*i* and the backplane pad 22, and the residual electrode structure 32 is located between the second electrode pad 141 of the first micro light-emitting element 100*i* and the backplane pad 23. Each of the residual electrode structures 31, 32 includes a eutectic layer 32, a barrier layer 34 and a bonding layer 36 arranged in sequence, where the eutectic layer 32 is adjacent to the backplane pads 22, 23.

In the embodiment, since the first micro light-emitting element 100*i* is connected to the residual electrode structures 31, 32, the second micro light-emitting element 100*f* is not connected to the residual electrode structures 31, 32, and the residual electrode structures 31, 32 themselves have a certain height, a first height H1 of the first micro light-emitting element 100*i* is greater than a second height H2 of the second micro light-emitting element 100*f*.

In summary, the electrode structure of the micro light-emitting element is arranged on the top surface of the epitaxial structure and extends through the opening of the insulating layer to be electrically connected to the epitaxial structure. The sacrificial layer is sandwiched between the surface of the insulating layer and the corresponding electrode structure. Namely, the electrode pad of the electrode structure may be separated from the surface of the insulating layer by the sacrificial layer, and the electrode pillar of the electrode structure may be connected to the electrode pad and extends through the opening of the insulating layer to be electrically connected to the epitaxial structure. When the micro light-emitting element is to be removed from the backplane pads of the display backplane (or other circuit boards), the sacrificial layer is removed first, and a connection strength between the insulating layer and the electrode pad of the electrode structure is reduced, in addition, a cross-sectional area of the electrode pillar is smaller, and it is easier to break, so that the epitaxial structure and the insulating layer may be removed from the backplane pad of the display backplane. Since a fracture position of the electrode structure is at the electrode pillar of the electrode structure rather than the electrode pad connected with the backplane pads of the display backplane, after the epitaxial structure and the insulating layer are removed from the backplane pads of the display backplane, the backplane pads and the connected circuits themselves are not pulled and damaged, and may be used for connecting with new micro light-emitting elements. Therefore, there is no need to set spare pads on the display backplane (or other circuit boards), and the circuit layout on the display backplane (or other circuit boards) may be more flexible and elastic.

What is claimed is:

1. A micro light-emitting element, comprising:

an epitaxial structure, comprising a top surface and a side surface;

an insulating layer, disposed on the top surface and the side surface of the epitaxial structure and comprising an opening;

an electrode structure, disposed on the top surface of the epitaxial structure and comprising an electrode pillar extending through the opening of the insulating layer to be electrically connected to the epitaxial structure and an electrode pad located on a surface of the insulating layer away from the epitaxial structure; and a sacrificial layer, sandwiched between the surface of the insulating layer and the corresponding electrode pad, wherein the electrode pillar and the electrode pad are connected to each other and integrally formed, wherein an orthogonal projection area of the electrode pad on the surface is greater than and covers an orthogonal projection area of the corresponding electrode pillar on the surface.

2. The micro light-emitting element as claimed in claim 1, wherein an orthogonal projection area of the sacrificial layer on the surface is greater than or equal to an orthogonal projection area of the corresponding electrode structure on the surface.

3. The micro light-emitting element as claimed in claim 1, wherein the sacrificial layer is disposed around the electrode pillar.

4. The micro light-emitting element as claimed in claim 1, wherein the electrode pillar extends along a first direction and comprises a first segment portion and a second segment portion in the first direction, the second segment portion is located between the first segment portion and the electrode pad, and a cross-sectional area of the second segment portion is less than a cross-sectional area of the first segment portion.

5. The micro light-emitting element as claimed in claim 4, wherein the first segment portion is located in the opening, and the sacrificial layer contacts the second segment portion.

6. The micro light-emitting element as claimed in claim 1, wherein the electrode pad comprises a first bonding layer, a barrier layer and a second bonding layer arranged in sequence, and the first bonding layer is connected to the corresponding electrode pillar, wherein the first bonding layer and the second bonding layer are of a same material.

7. The micro light-emitting element as claimed in claim 1, wherein the electrode pad comprises a first electrode pad, and a second electrode pad; and the electrode pillar comprises a first electrode pillar connected to the first electrode pad, and a second electrode pillar connected to the second electrode pad; the first electrode pillar and the second electrode pillar extend along a first direction; a connection line between the first electrode pad and the second electrode pad extends along a second direction; in the second direction, a length of a cross-section of the first electrode pillar in the first direction is different from a length in a third direction; and in the second direction, a length of a cross-section of the second electrode pillar in the first direction is different from a length in the third direction, wherein the third direction is perpendicular to the first direction and the second direction.

8. The micro light-emitting element as claimed in claim 1, wherein the electrode pad comprises a first electrode pad and a second electrode pad; and the electrode pillar comprises a first electrode pillar connected to the first electrode pad, and a second electrode pillar connected to the second electrode pad; the first electrode pillar and the second electrode pillar respectively comprises an inner side surfaces facing each other and an outer side surfaces facing away from each other; the sacrificial layer comprises two sacrificial blocks; the two sacrificial blocks are respectively arranged on the two outer side surfaces; and the two inner side surfaces are exposed.

9. A micro light-emitting element display device, comprising:

a display backplane, comprising a plurality of backplane pads; and a plurality of micro light-emitting elements, arranged on the display backplane, wherein each of the plurality of micro light-emitting elements comprises:

an epitaxial structure, comprising a top surface and a side surface;

an insulating layer, disposed on the top surface and the side surface of the epitaxial structure and comprising an opening; and an electrode structure, disposed on the top surface of the epitaxial structure and extending through the opening of the insulating layer to be electrically connected to the epitaxial structure and connected to at least one of the plurality of backplane pads, wherein there is a gap between the electrode structure and a surface of the insulating layer, wherein the electrode structure comprises an electrode pillar extending through the opening of the insulating layer and an electrode pad located on a surface of the insulating layer away from the epitaxial structure; and the electrode pillar is connected to the electrode pad, wherein an orthogonal projection area of the electrode pad on the surface is greater than and covers an orthogonal projection area of the corresponding electrode pillar on the surface.

10. The micro light-emitting element display device as claimed in claim 9, further comprising a sacrificial layer disposed in the gap.

11. The micro light-emitting element display device as claimed in claim 9, wherein the gap is an air gap.

12. The micro light-emitting element display device as claimed in claim 9, wherein the plurality of micro light-emitting elements comprise a first micro light-emitting element and a second micro light-emitting element connected to a residual electrode structure, the residual electrode structure is located between the electrode pad of the first micro light-emitting element and the corresponding backplane pad, the residual electrode structure comprises an eutectic layer, a barrier layer and a bonding layer arranged in sequence, and the eutectic layer is close to the backplane pad.

13. The micro light-emitting element display device as claimed in claim 12, wherein a first height of the first micro light-emitting element is greater than a second height of the second micro light-emitting element.

* * * * *